United States Patent
Endo et al.

(10) Patent No.: US 9,175,391 B2
(45) Date of Patent: Nov. 3, 2015

(54) APPARATUS AND METHOD FOR COMBINATORIAL GAS DISTRIBUTION THROUGH A MULTI-ZONED SHOWERHEAD

(75) Inventors: Richard Endo, San Carlos, CA (US); Tony P. Chiang, Campbell, CA (US)

(73) Assignee: Intermolecular, Inc., San Jose, CA (US)

(*) Notice: Subject to any disclaimer, the term of this patent is extended or adjusted under 35 U.S.C. 154(b) by 1058 days.

(21) Appl. No.: 13/116,796

(22) Filed: May 26, 2011

(65) Prior Publication Data
US 2012/0301616 A1 Nov. 29, 2012

(51) Int. Cl.
| | |
|---|---|
| *C23C 16/455* | (2006.01) |
| *C23C 16/52* | (2006.01) |
| *C23C 16/04* | (2006.01) |
| *H01J 37/32* | (2006.01) |

(52) U.S. Cl.
CPC ........... *C23C 16/45565* (2013.01); *C23C 16/04* (2013.01); *C23C 16/455* (2013.01); *C23C 16/45514* (2013.01); *C23C 16/45517* (2013.01); *C23C 16/45519* (2013.01); *C23C 16/45587* (2013.01); *C23C 16/52* (2013.01); *H01J 37/3244* (2013.01); *H01J 37/32366* (2013.01); *H01J 37/32449* (2013.01)

(58) Field of Classification Search
CPC ............ C23C 16/455; C23C 16/45514; C23C 16/45517; C23C 16/45519; C23C 16/45587
USPC .......................... 118/715; 156/345.33, 345.34
See application file for complete search history.

(56) References Cited

U.S. PATENT DOCUMENTS

| | | | | |
|---|---|---|---|---|
| 4,979,467 | A  * | 12/1990 | Kamaji et al. | 118/723 E |
| 6,161,500 | A  * | 12/2000 | Kopacz et al. | 118/723 E |
| 6,368,987 | B1 * | 4/2002 | Kopacz et al. | 438/788 |
| 6,872,259 | B2 * | 3/2005 | Strang | 118/715 |
| 7,972,469 | B2 * | 7/2011 | Hanawa et al. | 156/345.46 |
| 7,976,631 | B2 * | 7/2011 | Burrows et al. | 118/715 |
| 8,129,288 | B2 * | 3/2012 | Shanker et al. | 438/761 |
| 8,475,625 | B2 * | 7/2013 | Pamarthy et al. | 156/345.33 |
| 8,771,418 | B2 * | 7/2014 | Je et al. | 118/715 |
| 2003/0019580 | A1 * | 1/2003 | Strang | 156/345.33 |
| 2005/0028935 | A1 * | 2/2005 | Wickramanayaka et al. | 156/345.34 |
| 2006/0219362 | A1 * | 10/2006 | Han et al. | 156/345.33 |
| 2008/0257261 | A1 * | 10/2008 | Hanawa et al. | 118/719 |
| 2009/0061083 | A1 | 3/2009 | Chiang et al. | |
| 2009/0275210 | A1 * | 11/2009 | Shanker et al. | 438/761 |
| 2010/0136216 | A1 * | 6/2010 | Tsuei et al. | 427/9 |
| 2012/0135145 | A1 * | 5/2012 | Je et al. | 427/248.1 |
| 2012/0315396 | A1 * | 12/2012 | Endo et al. | 427/255.7 |
| 2014/0224177 | A1 * | 8/2014 | Park et al. | 118/730 |

* cited by examiner

*Primary Examiner* — Rudy Zervigon

(57) ABSTRACT

A multi-zone, combinatorial, single wafer showerhead is used to concurrently develop hardware, materials, unit processes, and unit process sequences. The multi-zone, combinatorial, single wafer showerhead utilizes showerhead pucks to perform process sequences on isolated regions of a single substrate. The showerhead pucks are designed so that they are easily interchangeable to allow the characterization of the interaction between hardware characteristics, process parameters, and their influence on the result of the process sequence.

13 Claims, 11 Drawing Sheets

APPARATUS AND METHOD FOR COMBINATORIAL GAS DISTRIBUTION THROUGH A MULTI-ZONED SHOWERHEAD

FIELD OF THE INVENTION

The present invention relates generally to thin film deposition, and, more particularly, to thin film deposition using combinatorial processing.

BACKGROUND OF THE INVENTION

The manufacture of integrated circuits (IC), semiconductor devices, flat panel displays, optoelectronics devices, data storage devices, magneto-electronic devices, magneto-optic devices, packaged devices, and the like entails the integration and sequencing of many unit processing steps. As an example, IC manufacturing typically includes a series of processing steps such as cleaning, surface preparation, deposition, lithography, patterning, etching, planarization, implantation, thermal annealing, and other related unit processing steps. The precise sequencing and integration of the unit processing steps enables the formation of functional devices meeting desired performance metrics such as speed, power consumption, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

Many of the unit processing steps comprise the formation or deposition of thin films of materials. Typical deposition techniques comprise atomic layer deposition (ALD), atomic vapor deposition (AVD), plasma enhanced atomic layer deposition (PE-ALD), chemical vapor deposition (CVD), plasma enhanced chemical vapor deposition (PECVD), high density plasma enhanced chemical vapor deposition (HDP-CVD), sub-atmospheric chemical vapor deposition (SACVD), ion assisted chemical vapor deposition (IA-CVD), and others. Most of these techniques use a showerhead arrangement to deliver the precursor gases to the surface of the substrate to deposit the thin film. The uniformity and properties of these materials are determined by the process parameters and details of the hardware used to deposit the thin films. Examples of process parameters comprise temperature, pressure, choice of gas species, gas flow rates, gas compositions, deposition time, applied plasma power (if used), etc. Examples of the details of the hardware (i.e. showerhead details) comprise the number of independent precursor channels in the showerhead, the spatial configuration of the channels, the number and size of the channels, the showerhead to substrate spacing, etc.

Typically, there are significant interactions between the process parameters, the details of the hardware, and the properties of the deposited material. A large number of experiments must be completed to optimize the process parameters to deposit a material with the desired properties. This number of experiments must be repeated for each hardware configuration. Showerhead assemblies are costly and have a long manufacturing time. Furthermore, they are designed to deposit material across the entire substrate. Therefore, a complete substrate must be used for each experimental process parameter test. In many cases, the substrate has undergone significant processing prior to the unit process being optimized. This further adds to the cost and complexity of the development activity.

Therefore, there is a need to develop showerhead assemblies that allow the cost efficient and timely optimization of the process parameters and hardware details to deposit materials with the desired properties. Furthermore, there is a need to develop showerhead assemblies that allow the interactions between the process parameters and the hardware details to be evaluated.

SUMMARY OF THE INVENTION

In some embodiments of the present invention, showerhead assemblies are described that allow the testing of different process parameters and different hardware details on multiple site isolated regions of a single substrate. In some embodiments of the present invention, showerhead assemblies are described that are configurable and allow the hardware details to be changed and tested in a cost effective and timely manner. These showerhead assemblies facilitate the use of HPC methods for the concurrent optimization of the process parameters and the hardware details. These showerhead assemblies are compatible with known deposition techniques such as ALD, AVD, PE-ALD, CVD, PECVD, HDP-CVD, SACVD, IA-CVD, and others. Those skilled in the art will appreciate that these are just examples and that the invention described herein may be applied to many different known deposition technologies.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Figure 1:
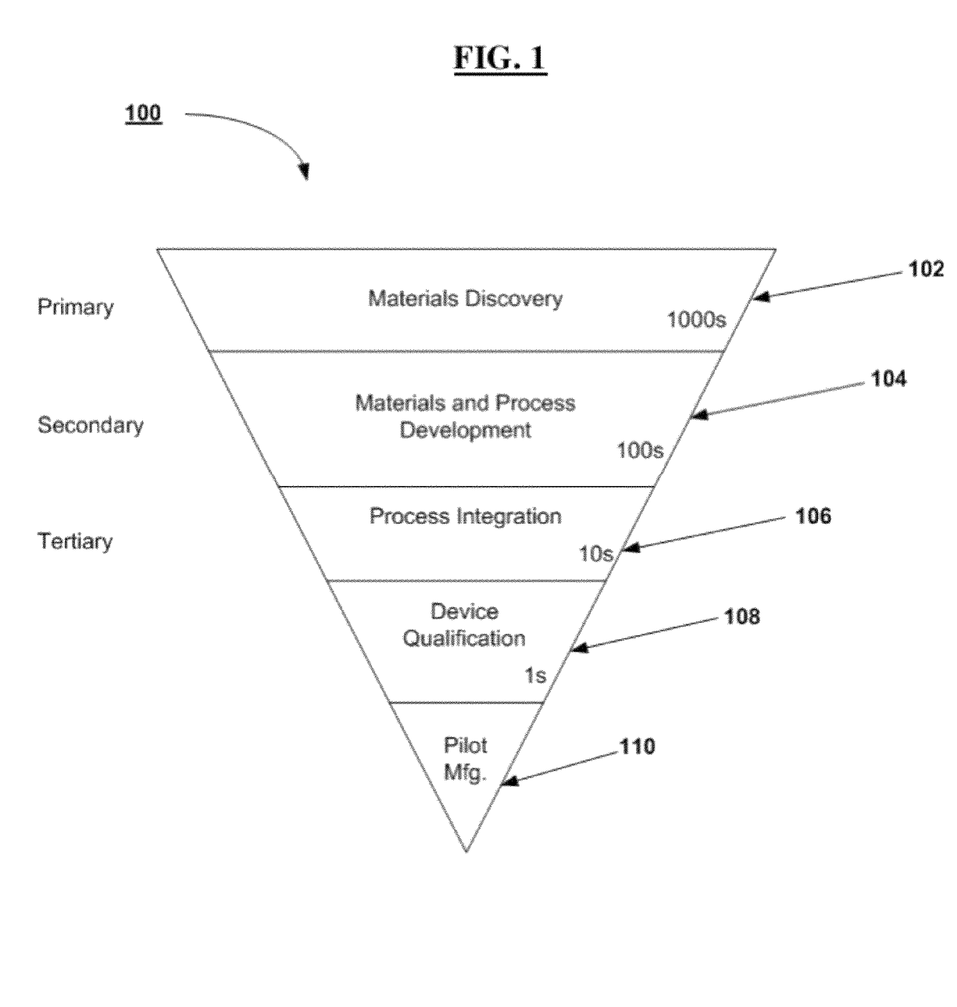
FIG. 1 is a schematic diagram for implementing combinatorial processing and evaluation.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results. At each stage, materials, processing parameters, and hardware details must be evaluated and selected.

For example, thousands of materials are evaluated during a materials discovery stage, 102. Materials discovery stage, 102, is also known as a primary screening stage performed using primary screening techniques. Primary screening techniques may include dividing wafers into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes and hardware used to deposit or develop those materials. Promising materials, processes, and hardware are again selected, and advanced to the tertiary screen or process integration stage, 106, where tens of materials and/or processes and/or hardware details and combinations are evaluated. The tertiary screen or process integration stage, 106, may focus on integrating the selected processes and materials with other processes and materials.

The most promising materials, processes, and hardware from the tertiary screen are advanced to device qualification, 108. In device qualification, the materials, processes, and hardware selected are evaluated for high volume manufacturing, which normally is conducted on full wafers within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a semiconductor device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed semiconductor substrate that are equivalent to the structures formed during actual production of the semiconductor device. For example, such structures may include, but would not be limited to, trenches, vias, interconnect lines, capping layers, masking layers, diodes, memory elements, gate stacks, transistors, or any other series of layers or unit processes that create an intermediate structure found on semiconductor chips. While the combinatorial processing varies certain materials, unit processes, hardware details, or process sequences, the composition or thickness of the layers or structures or the action of the unit process, such as cleaning, surface preparation, etch, deposition, planarization, implantation, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
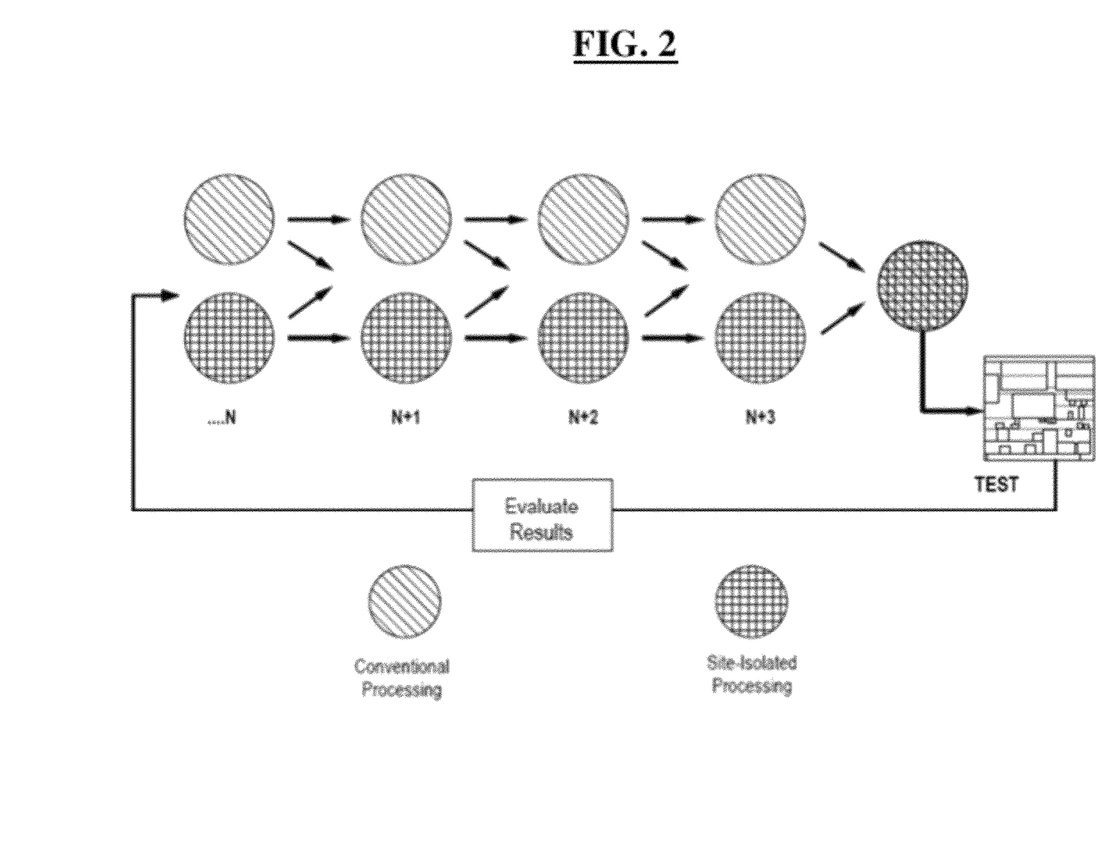
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, e.g. wafers as shown or portions of monolithic substrates such as coupons or wafer coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region.

Further, the potential overlap is only allowed with material of processes that will not adversely affect the result of the tests. Both types of regions are referred to herein as regions or discrete regions.

Figure 3:
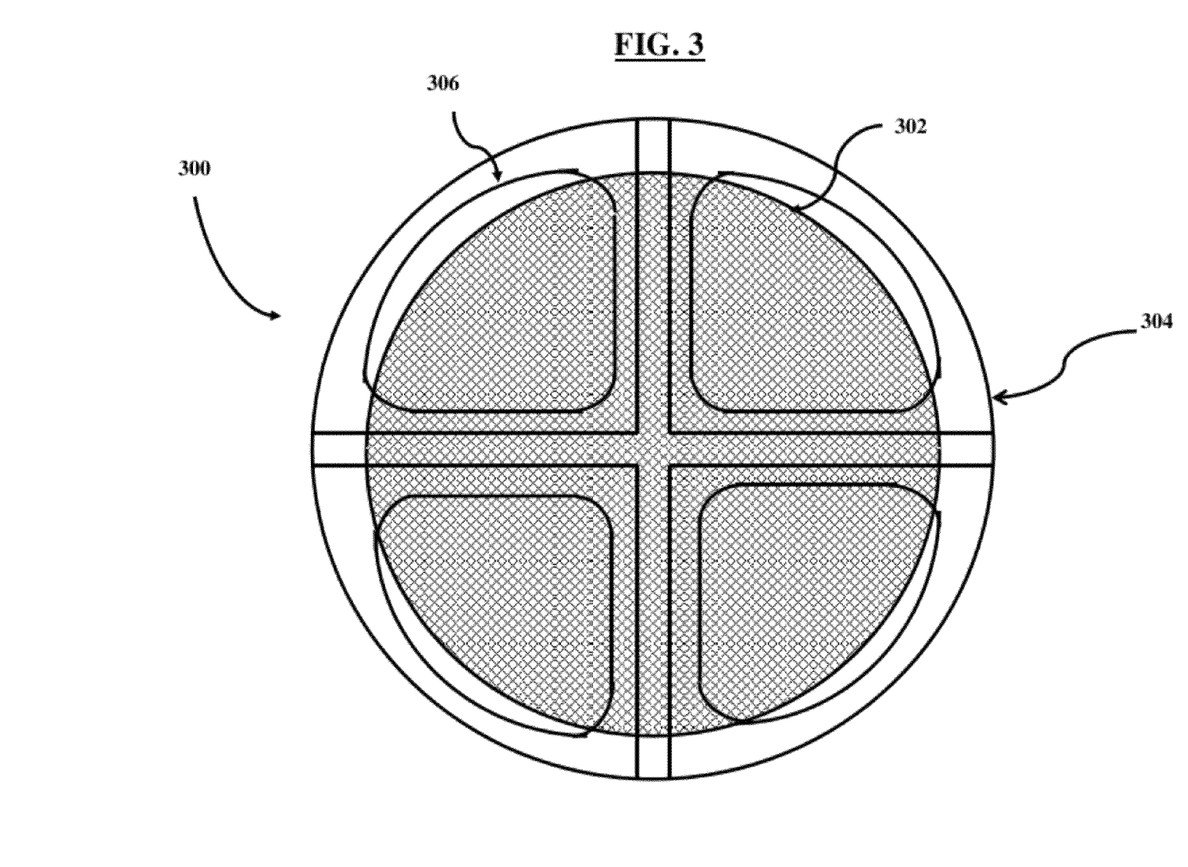
FIG. 3 illustrates a schematic diagram of a combinatorial showerhead and wafer according to an embodiment herein.

FIG. 3 illustrates a schematic diagram of a multi-zone, combinatorial showerhead, 300, and substrate, 302. As illustrated in FIG. 3, showerhead assembly, 300, completely covers substrate, 302. Also illustrated in FIG. 3 are mounting frame, 304, and showerhead puck, 306 which are described in detail below. In some embodiments herein, showerhead assembly, 300, is a configurable, multi-zone, combinatorial, single wafer showerhead compatible with any of the deposition technologies listed previously, as well as others.

Figure 4:
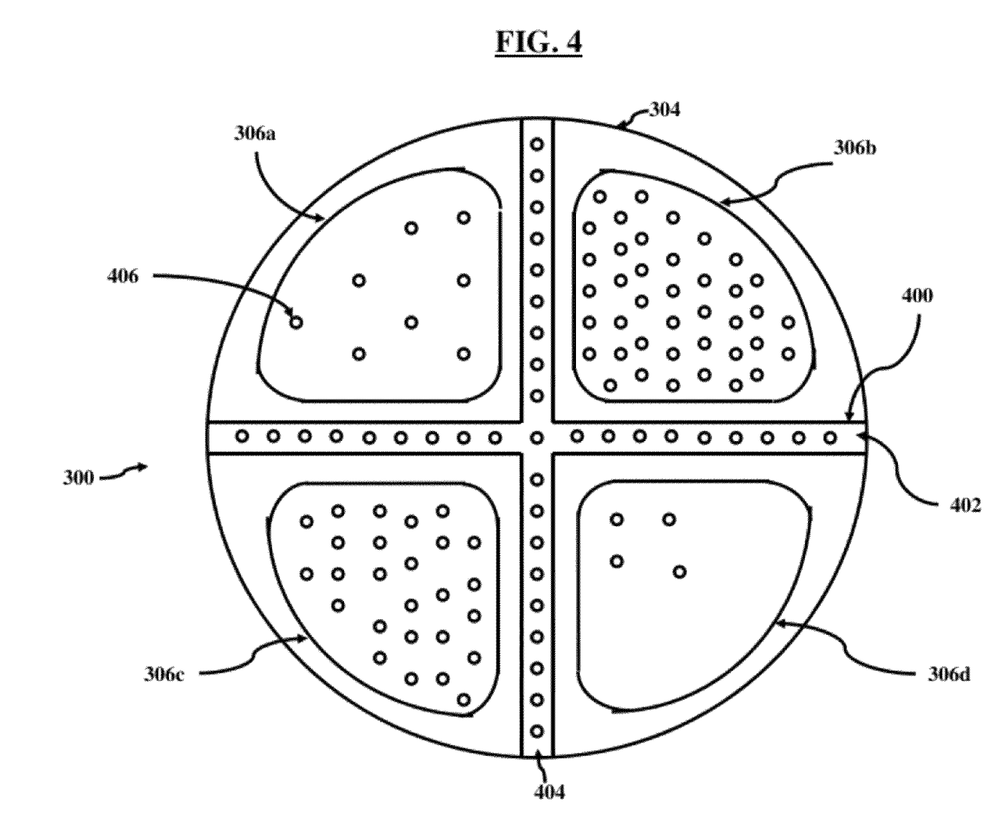
FIG. 4 illustrates a schematic diagram of a combinatorial showerhead according to an embodiment herein.

FIG. 4 illustrates a schematic diagram of a multi-zone, combinatorial showerhead, 300, according to some embodiments described herein. Substrate, 302, has not been shown for clarity. As illustrated in FIG. 4, showerhead assembly, 300, is comprised of four independent showerhead pucks, 306a, 306b, 306c, and 306d. Although four are shown, those skilled in the art will appreciate that the showerhead can be divided into any number of independent sectors. For example, showerhead assemblies may be design wherein the number of sectors is one of 2, 3, 4, 5, 6, 7, or 8. Each of the showerhead pucks are illustrated with a plurality of channels, 406, through which gases are introduced into the process chamber. The varying number of channels within each showerhead puck illustrate that the hardware details of each showerhead puck can be different and can be varied in a combinatorial manner. The channels, 406, within a given showerhead puck may introduce the same gas or the channels may be grouped to introduce different gases to the region under a given showerhead puck. Also illustrated in FIG. 4 is purge channel, 400. Purge channel, 400, bisects showerhead assembly, 300, along a first direction, 402, and along a second direction, 404, that is orthogonal to the first direction. In FIG. 4, purge channel, 400, divides the showerhead into four regions. Generally, the purge channel will divide the showerhead into a number of regions equal to the number of showerhead pucks used in that specific configuration. Inert gases are introduced in purge channel, 400, to prevent the precursor gases from the regions under each showerhead puck from mixing and interacting. This feature ensures that the region on the substrate under each showerhead puck is isolated from the others. This isolation allows multiple experiments to be conducted independently on a single substrate.

Figure 5:
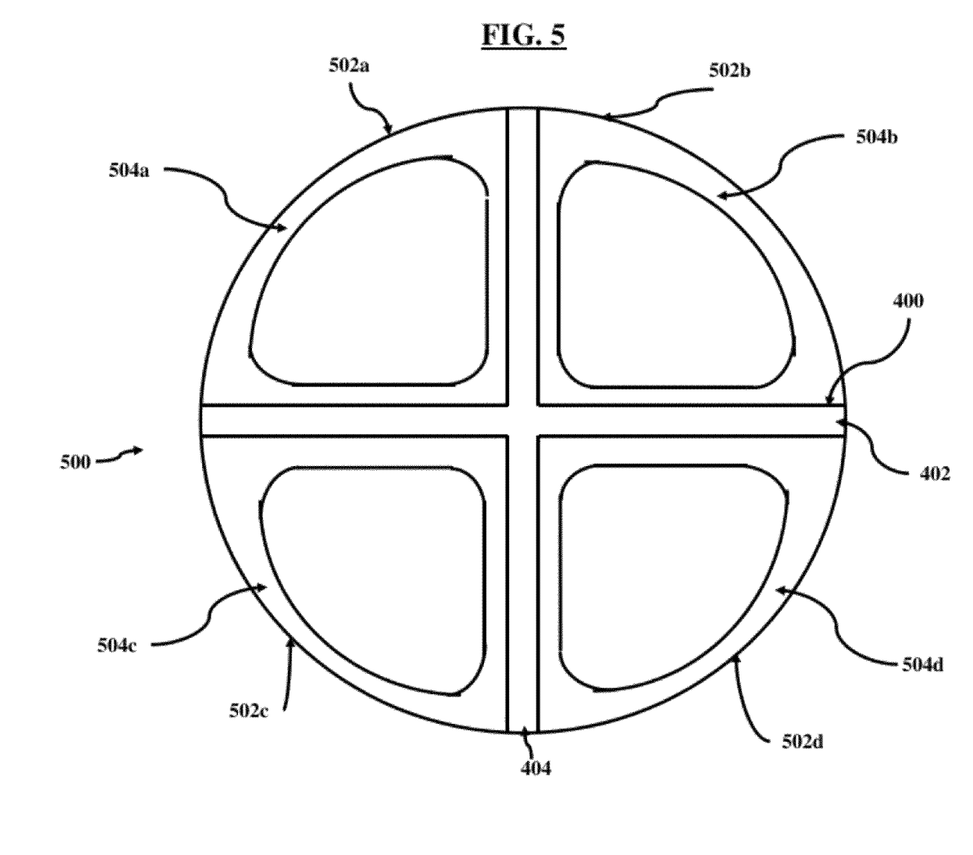
FIG. 5 illustrates a schematic diagram of a combinatorial showerhead with several blank mounting frames according to an embodiment herein.

FIG. 5 illustrates backing plate, 500, that serves as the structural support for mounting frames, 504a, 504b, 504c, and 504d. In FIG. 5, backing plate, 500, divides the showerhead into four regions. Generally, the backing plate will divide the showerhead into a number of regions equal to the number of showerhead pucks used in that specific configuration. In FIG. 5, the regions corresponding to purge channel, 400, and associated bisecting directions, 402 and 404, are also illustrated. Backing plate, 500, serves as a structural support upon which mounting frames and showerhead pucks (not shown) can be mounted. The sections of the backing plate, 502a, 502b, 502c, and 502d, are independent and allow each segment to test different hardware detail options and/or different process parameters. This configuration allows the testing of a wide variety of showerhead puck configurations without having to manufacture a complete showerhead assembly with the test configuration.

Figure 6:
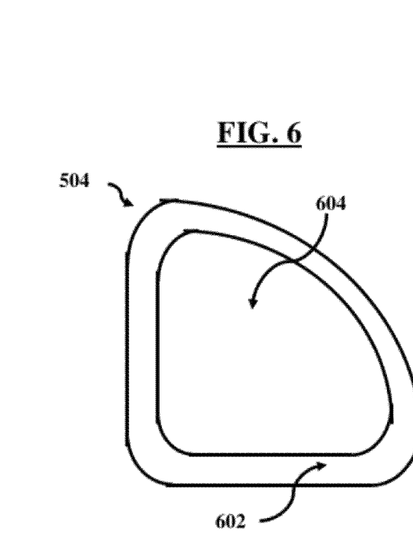
FIG. 6 illustrates a mounting frame according to an embodiment herein.

FIG. 6 illustrates one of the mounting frames, 504, that is used as the mechanism for coupling backing plate, 500, (not shown) and showerhead pucks, 306, (not shown). There will be a mounting frame for each section of the showerhead (four are shown in FIG. 5). The mounting frames, 504, comprise an outer frame, 602, that surrounds an inner cavity, 604. Outer frame, 602, comprises mounting features such as through holes, tapped mounting holes, etc. as well as sealing features such as o-ring grooves, etc. The mounting frames, 504, capture the showerheads pucks and hold them against the backing plate in each section. The showerhead pucks may be sealed against the backing plate using common sealing techniques such as o-rings or may be sealed using a simple face seal. The inner cavity, 604, of the mounting frame allows the channels of the showerhead puck to access the substrate and deliver process gases to the process chamber.

Figure 7:
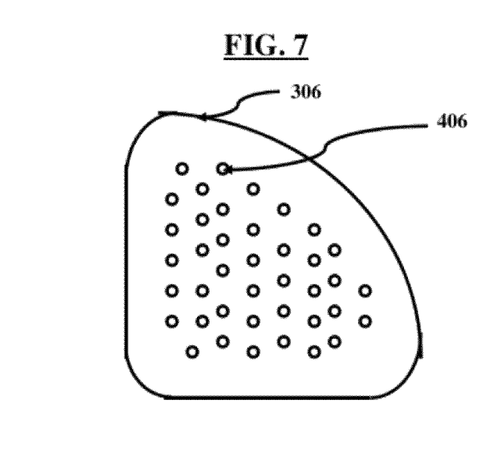
FIG. 7 illustrates a showerhead puck according to an embodiment herein.

FIG. 7 illustrates showerhead puck, 306, comprising channels, 406. The showerhead pucks may be different in each section of the showerhead. The use of showerhead pucks, 306, allows features of the showerhead such as channel size, channel distribution, showerhead thickness, substrate to showerhead distance, etc. to be varied in a combinatorial manner and to be evaluated quickly and in a cost effective manner. The showerhead pucks can be quickly and cost effectively manufactured and tested without the need to manufacture a complete showerhead assembly. Moreover, a number of configurations can be evaluated concurrently by configuring the showerhead assembly with multiple showerhead pucks with different features.

Figure 8:
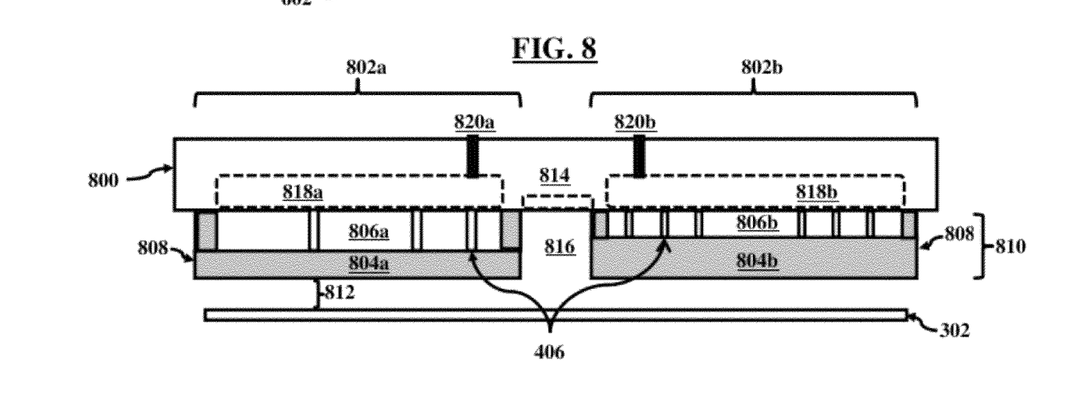
FIG. 8 illustrates a cross-sectional view of a combinatorial showerhead according to an embodiment herein.

FIG. 8 illustrates a cross section of a multi-zone, combinatorial, single wafer showerhead compatible with typical ALD, CVD, surface treatment, or etch processes. Two sections, 802a and 802b are shown. These may correspond to sections such as 502a and 502b as illustrated in FIG. 5. Backing plate, 800, is shown with internal cavities, 818a and 818b. These cavities are coupled to a gas supply (not shown) with gas inlets, 820a and 820b. The cavities distribute the gas evenly to the channels, 406, in the showerhead pucks, 806a and 806b. Showerhead pucks, 806a and 806b are coupled to the backing plate using the mounting frames, 804a and 804b. Note that in FIG. 8, the thickness of showerhead puck 806a has been illustrated to be greater than the thickness of showerhead puck 806b. This is one characteristic of the showerhead pucks that has an influence on the process performance and must be evaluated. However, the distance, 812, from the bottom of the mounting frames, 804a and 804b to the substrate, 302, must be constant. Therefore, the thicknesses of mounting frames, 804a and 804b must be different and must be matched with the thickness of the showerhead pucks to keep an overall thickness, 810, of the combined showerhead puck and mounting frame constant. Also shown in FIG. 8 is a small cavity, 814, that supplies inert gas to the purge regions, 816, that serve to isolate the regions under the various showerhead pucks from one another and prevent cross-contamination.

Figure 9:
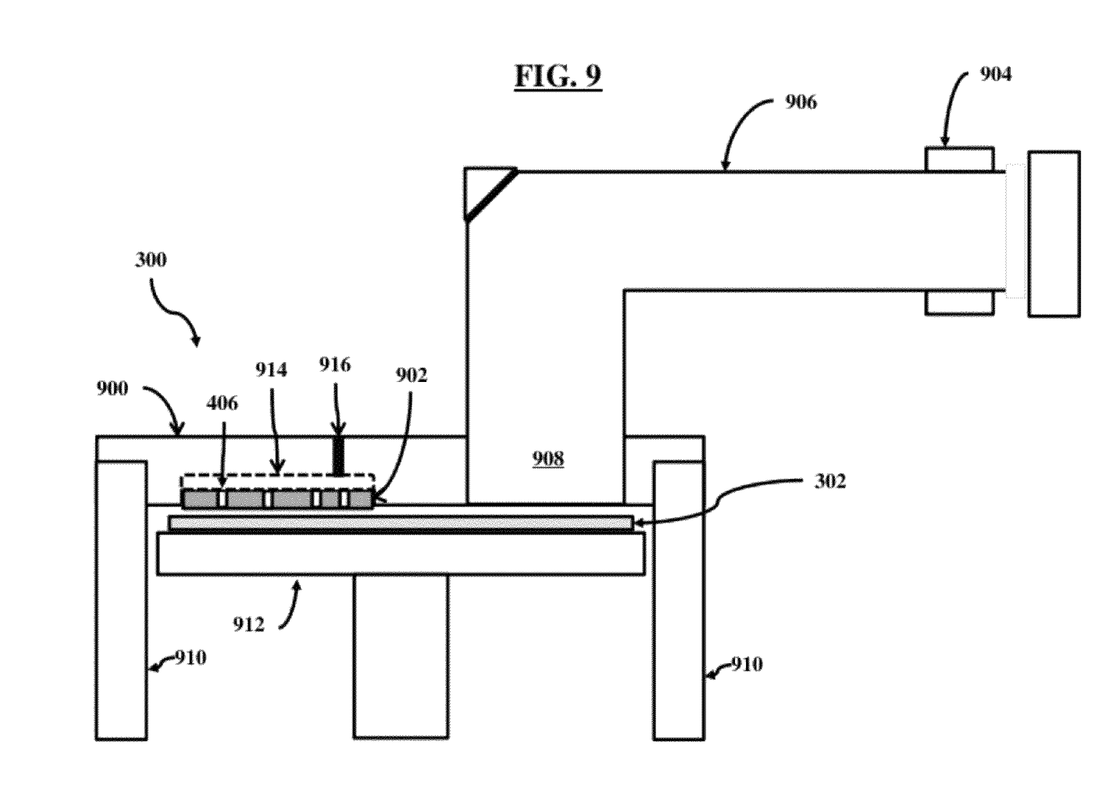
FIG. 9 illustrates a showerhead with a remote source plasma generator according to an embodiment herein.

FIG. 9 illustrates a cross section of a process chamber incorporating a multi-zone, combinatorial, single wafer showerhead compatible with remote plasma technologies. The process chamber may be part of a larger vapor deposition system that comprises one or more process chambers. FIG. 9 illustrates a substrate, 302, supported on a pedestal, 912. Pedestal, 912, serves to support the substrate and can move in the x and y directions under the showerhead assembly, 300. Additionally, pedestal, 912, can move in the z direction to modify the distance between the substrate, 302, and the showerhead assembly, 300. Finally, pedestal, 912, can rotate the substrate around a central axis. These four degrees of movement for pedestal, 912, allows multiple regions of substrate, 302, to be exposed to different process conditions. In FIG. 9, showerhead assembly, 300, is sealed to chamber wall, 910. Showerhead assembly, 300, comprises multiple sections, two of which are illustrated in FIG. 9. One section is illustrated by the region under conduit, 906. Conduit, 906, has an opening, 908, that exposes sections of substrate, 302, to plasma generated species. The plasma generated species are formed by plasma source, 904. Another section is illustrated by the region under showerhead puck 902. In this region, a non-plasma deposition process may be performed. A more complete description of the apparatus and methods for utilizing plasma technology in a multi-zone, combinatorial, single wafer showerhead is contained in U.S. application Ser. No. 13/159,188 filed on Jun. 13, 2011, entitled "APPARATUS AND METHOD FOR COMBINATORIAL PLASMA DISTRIBUTION THROUGH A MULTI-ZONED SHOWERHEAD" and is incorporated herein by reference. Showerhead puck, 902, is coupled to backing plate, 900, using a mounting frame (not shown) as described previously. Backing plate, 900, comprises an internal cavity, 914, that supplies gas to the channels, 406, through the showerhead puck. The internal cavity, 914, is connected to a gas supply (not shown) through gas inlet, 916. This showerhead assembly allows multiple process sequences, some of which utilize plasma to be performed on multiple regions of a single substrate.

Figure 10:
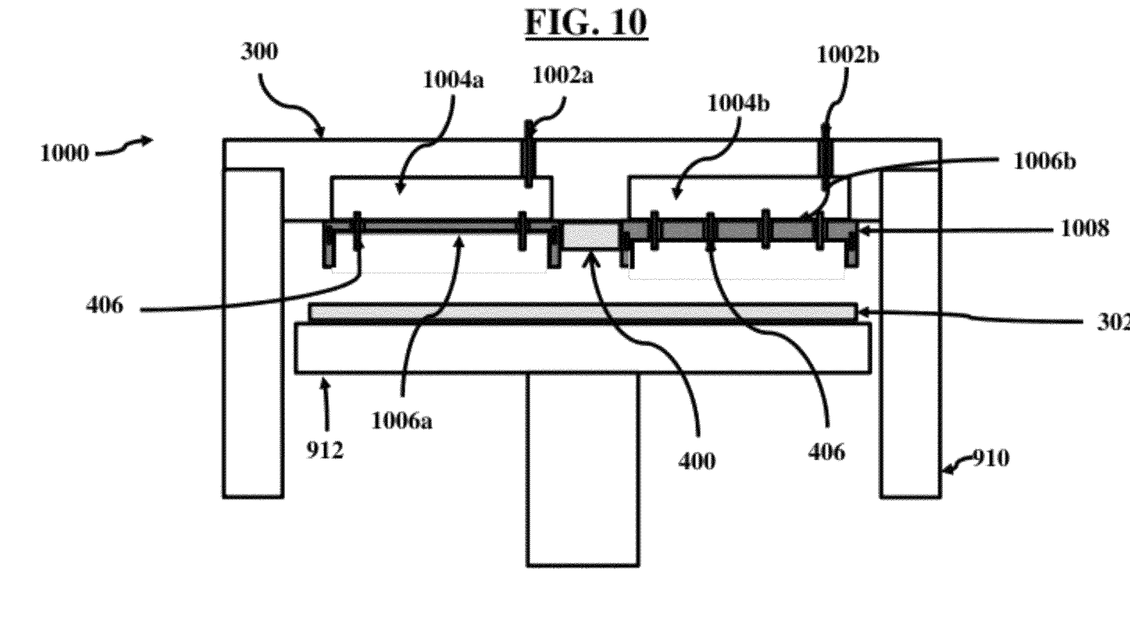
FIG. 10 illustrates another showerhead according to an embodiment herein.

FIG. 10 illustrates a cross section of a process chamber incorporating a multi-zone, combinatorial, single wafer showerhead illustrating two sections. The process chamber may be part of a larger vapor deposition system that comprises one or more process chambers. Showerhead, 300, includes gas inlet channels, 1002a and 1002b for introducing precursor gases into showerhead cavities, 1004a and 1004b and is sealed to chamber wall, 910. Cavities, 1004a and 1004b, distribute the precursor gases evenly behind showerhead pucks 1006a and 1006b. Showerhead pucks, 1006a and 1006b, are illustrated with different numbers of channels, 406, to indicate that they have different hardware configurations. Also illustrated in FIG. 10, is a showerhead puck thickness, 1008, that is shown to be different between the two showerhead pucks. As shown, the thickness of showerhead puck, 1006b is greater than the thickness of showerhead puck, 1006a. Also illustrated in FIG. 10 is a section of purge channel, 400, that serves to separate the region under showerhead puck 1006a from the region under showerhead puck, 1006b. Typically, an inert gas is flowed through purge channel, 400, and allows the regions under the showerhead pucks to be exposed to different process conditions without cross contamination. FIG. 10 illustrates a substrate, 302, supported on a pedestal, 912. Pedestal, 912, has the same range of motion discussed previously.

Figure 11A:
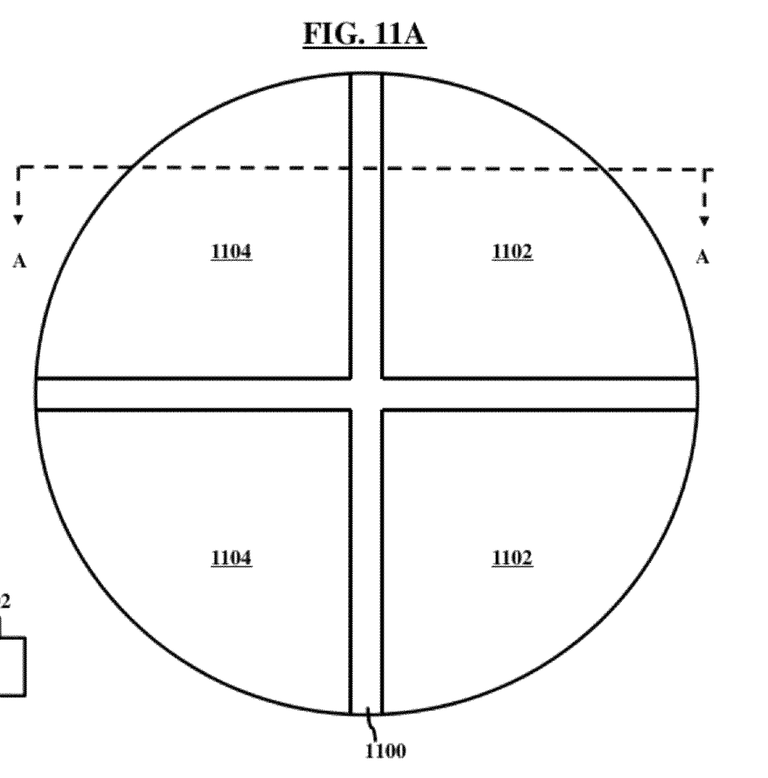
FIG. 11A illustrates a top down view of a substrate used to form test structures and process conditions according to an embodiment herein.
Figure 11B:
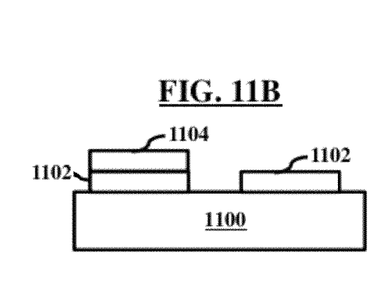
FIG. 11B illustrates a cross-sectional view of the substrate shown in FIG. 11A according to an embodiment herein.

FIGS. 11A and 11B illustrate a substrate, 1100, with multiple materials deposited thereon in four regions. As discussed previously, a multi-zone, combinatorial, single wafer showerhead may be envisioned that divides the substrate into any number of regions. FIG. 11A is a top view of the substrate indicating four regions of deposition, two regions denoted as 1102 and two regions denoted as 1104. FIG. 11B is a cross sectional view taken along the A-A reference line. As illustrated in FIG. 11B, a material, 1102, has been deposited in all four regions of the substrate. The 1102 material may be deposited using the same hardware and/or process conditions or each region may be deposited using the different hardware and/or process conditions. Also as illustrated in FIG. 11B, a material, 1104, has been deposited in two of the four regions of the substrate and on top of the underlying 1102 material. The 1104 material may be deposited using the same hardware and/or process conditions or each region may be deposited using the different hardware and/or process conditions. The area between the regions has no deposition. This configuration allows the material, 1102, to be independently tested as well as stacks of 1104 material on top of 1102 material to be tested on the same substrate. Using conventional processing apparatus and methods, this would require a minimum of four substrates and several different showerhead assemblies.

Figures 12A, 12B:
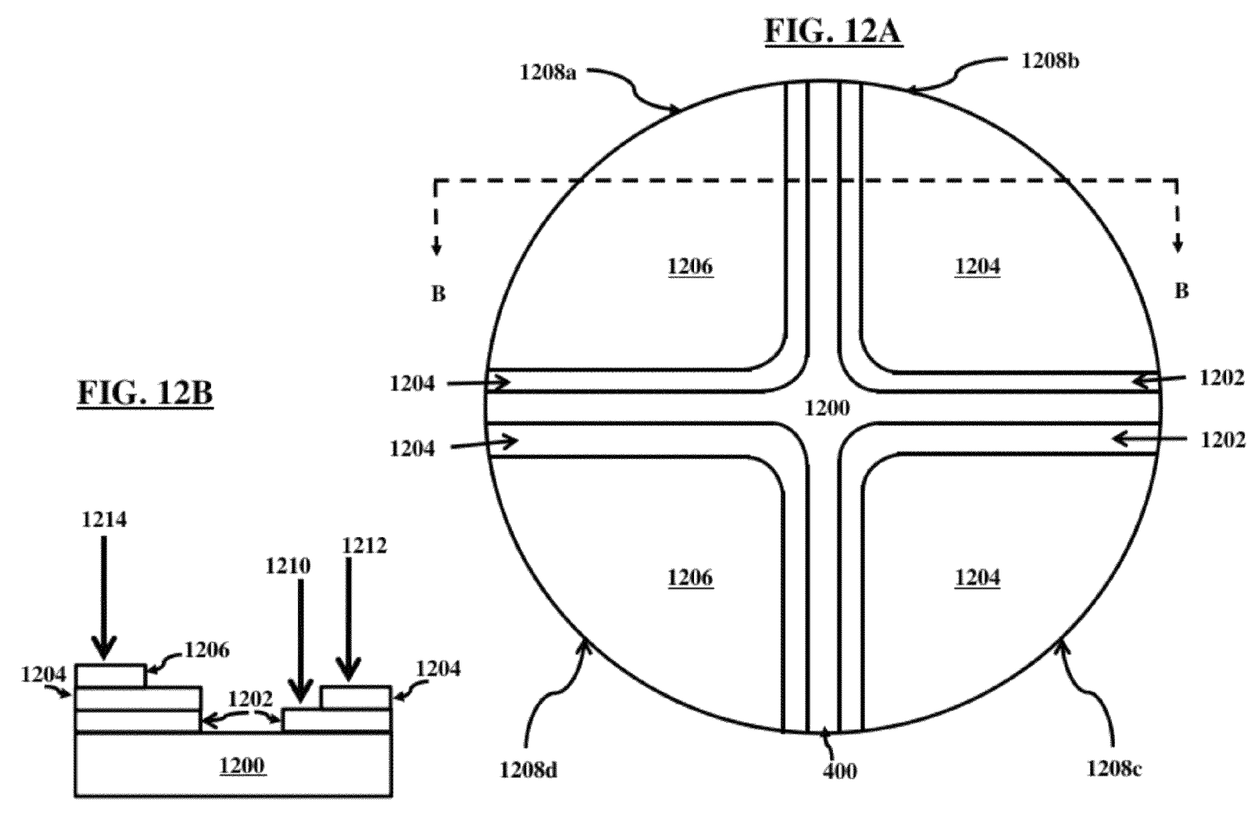
FIG. 12A illustrates another top down view of a substrate used to form test structures and process conditions according to an embodiment herein.
FIG. 12B illustrates a cross-sectional view of the substrate shown in FIG. 12A according to an embodiment herein.

FIGS. 12A and 12B illustrate a substrate, 1200, with multiple materials deposited thereon in four regions. As discussed previously, a multi-zone, combinatorial, single wafer showerhead may be envisioned that divides the substrate into any number of regions. FIG. 12A is a top view of the substrate indicating four regions of deposition, two regions denoted as 1204 and two regions denoted as 1206. FIG. 12B is a cross sectional view taken along the B-B reference line. As illustrated in FIG. 12B, a material, 1202, has been deposited on the substrate in all four regions of the substrate. The 1202 material may be deposited using the same hardware and/or process conditions or each region may be deposited using the different hardware and/or process conditions. Also as illustrated in FIG. 12A, a material, 1204, has been deposited in all four regions of the substrate and on top of the underlying 1202 material. The deposition of the 1204 material was such that small areas of the underlying 1202 material are still exposed. The 1204 material may be deposited using the same hardware and/or process conditions or each region may be deposited using the different hardware and/or process conditions. The area between the regions, 400, has no deposition. Also as illustrated in FIG. 12A, a material, 1206, has been deposited in two of the regions of the substrate and on top of the underlying 1204 material. The deposition of the 1206 material was such that small areas of the underlying 1204 material are still exposed. The 1206 material may be deposited using the same hardware and/or process conditions or each region may be deposited using the different hardware and/or process conditions. As illustrated in FIG. 12B, this configuration allows the material, 1202, to be independently tested (probe at arrow 1210); as well as bilayer stacks of 1204/1202 to be tested (probe at arrow 1212); and trilayer stacks of 1206/1204/1202 materials (probe at arrow 1214) to be tested on the same substrate. Using conventional processing apparatus and methods, this would require many substrates and several different showerhead assemblies.

Figure 13:
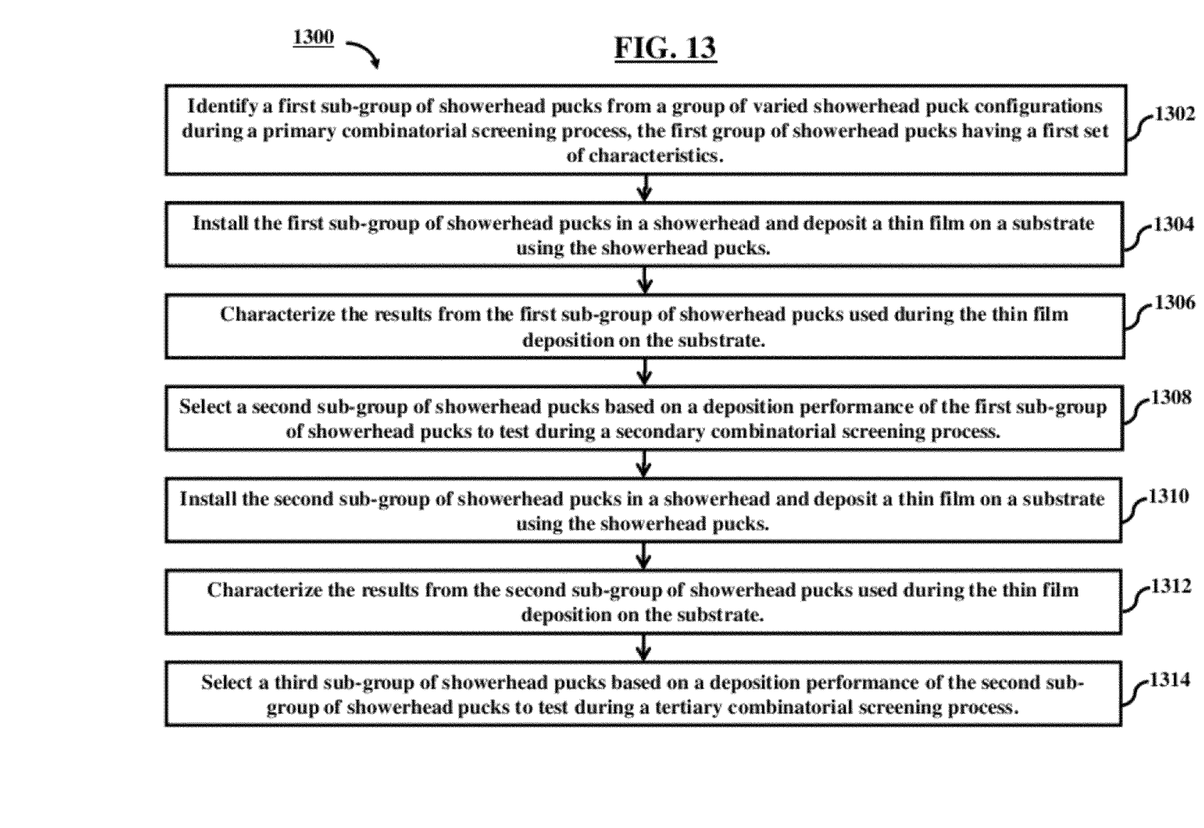
FIG. 13 is a flow diagram illustrating a method according to an embodiment herein.

FIG. 13 presents a flow chart, 1300, for a method for efficient process and hardware development using a multi-zone, combinatorial, single wafer showerhead. In step 1302, a sub-group of showerhead pucks are selected from a large group of showerhead puck configurations for initial testing. Generally, the showerhead pucks have a wide range of characteristics such as number of channels, size of channels, distribution of channels, showerhead puck thickness, etc. which can be varied in a combinatorial manner. In step, 1304, the first sub-group of showerhead puck is installed in a multi-zone, combinatorial, single wafer showerhead and thin films of interest are deposited on the substrates. As discussed previously, the process parameters may be varied through each showerhead puck and multiple thin films may be deposited to form multilayered stack that are of interest. In step, 1306, the properties of the deposited thin films are evaluated, characterized, and compared against a set of selection criteria. Examples of selection criteria comprise film composition, film uniformity, film deposition rate, film electrical properties, film density, film stress, film contamination content, particle contamination, material deposition on the showerhead puck surfaces, clogging of the channels in the showerhead pucks, etc. Steps 1302 through 1306 can be repeated as needed until all of the members of the initial sub-group of showerhead pucks are tested. In step, 1308, a second sub-group of showerhead pucks are selected for a second level of testing based on the results from the initial screening. In step, 1310, the second sub-group of showerhead puck is installed in a multi-zone, combinatorial, single wafer showerhead and thin films of interest are deposited on the substrates. In step, 1312, the properties of the deposited thin films are evaluated, characterized, and compared against a set of selection criteria. Steps 1308 through 1312 can be repeated as needed until all of the members of the second sub-group of showerhead pucks are tested. In step, 1314, a third sub-group of showerhead pucks are selected for a third level of testing based on the results from the second screening. Generally, the hardware evaluation is complete by this step, or the sequence of steps may be repeated as necessary until all of the selection criteria are met.

In one example, a multi-zone, combinatorial, single wafer showerhead may be configured wherein each showerhead puck comprises different characteristics such as number of channels, size of channels, distribution of channels, showerhead puck thickness, etc. which can be varied in a combinatorial manner. The showerhead assembly may be configured such that each showerhead puck performs the same process sequence. A thin film deposition process sequence will be used as an example. Those skilled in the art will understand that any showerhead compatible process sequence may be used such as surface treatment, etching, etc. In this configuration, a thin film of material is deposited on the region of the substrate that is located under each showerhead puck. The regions will be isolated from one another as discussed previously. Properties of the thin film and showerhead puck performance may be evaluated, characterized, and compared against a set of selection criteria. Examples of selection criteria comprise film composition, film uniformity, film deposition rate, film electrical properties, film density, film stress, film contamination content, particle contamination, material deposition on the showerhead puck surfaces, clogging of the channels in the showerhead pucks, etc. In this configuration, any differences in the film properties will be attributable to the differences in the characteristics of the various showerhead pucks.

In another example, a multi-zone, combinatorial, single wafer showerhead may be configured wherein each showerhead puck comprises the same characteristics such as number of channels, size of channels, distribution of channels, showerhead puck thickness, etc. The showerhead assembly may be configured such that each showerhead puck performs a different process sequence. A thin film deposition process sequence will be used as an example. Those skilled in the art will understand that any showerhead compatible process sequence may be used such as surface treatment, etching, etc. In this configuration, a thin film of material is deposited on the region of the substrate that is located under each showerhead puck. The regions will be isolated from one another as discussed previously. Properties of the thin film and showerhead puck performance may be evaluated, characterized, and compared against a set of selection criteria. Examples of selection criteria comprise film composition, film uniformity, film deposition rate, film electrical properties, film density, film stress, film contamination content, particle contamination, material deposition on the showerhead puck surfaces, clogging of the channels in the showerhead pucks, etc. In this configuration, any differences in the film properties will be attributable to the differences in the process sequence performed in the various showerhead pucks.

In yet another example, a multi-zone, combinatorial, single wafer showerhead may be used for an atomic layer deposition (ALD) process. In a typical ALD process, a first precursor, A, is delivered to the chamber. In the ideal case, this forms a self-limiting monolayer on the surface of the substrate. The first precursor, A, is removed from the chamber through pumping and/or purging. A reactant species is then introduced into the chamber and reacts with the monolayer of precursor A to form a portion of the thin film material. This sequence can be repeated until the desired thickness of the film is reached. In some cases, a multi-component film is desired. In this case, a second precursor, B, can be introduced to the chamber. In the ideal case, this forms a self-limiting monolayer of precursor, B, on the surface of the substrate. The second precursor, B, is removed from the chamber through pumping and/or purging. A reactant species is then introduced into the chamber and reacts with the monolayer of precursor B to form a portion of the thin film material. This can be repeated to form a thin film formed from the repeating sequence of A-B-A-B, etc. Alternatively, the amounts of "A" and "B" do not have to be the same and can be mixed in any desired ratio. ALD processes typically use complicated showerhead assemblies wherein the gases are kept separated until they are distributed into the chamber. This prevents the reaction between the various precursors and the reactant gases to form material within the showerhead chambers and channels.

Typically, the characteristics of the showerhead features are different for the various precursors and reactants used in multi-step ALD processes. Therefore, it is difficult to develop the proper hardware for each precursor and reactant using conventional showerhead technology. In this example, a multi-zone, combinatorial, single wafer showerhead may be used wherein each showerhead puck comprises different characteristics such as number of channels, size of channels, distribution of channels, showerhead puck thickness, etc optimized for each step of the multi-step ALD process. The showerhead assembly may be configured such that each showerhead puck performs a different portion of the ALD process sequence. The multi-step process sequence can be executed by sequentially moving the isolated region under the appropriate showerhead pucks. The showerhead pucks can be very simple with single-gas delivery configurations without the complexity of the multiple-gas showerhead technologies discussed previously. As an example, in this configuration, a region of the substrate is exposed to precursor, A, under a first showerhead puck. The substrate is then rotated under a second showerhead puck and the region is exposed to a reactant gas. The same region is then rotated under the precursor-A showerhead puck again and the sequence is repeated. Alternatively, the region of the substrate could be rotated under a third showerhead puck that delivers another precursor, B, and then rotated under a fourth showerhead puck that delivers the same or a different reactant gas. The regions will be isolated from one another as discussed previously. Thin films can be deposited on multiple regions on the same substrate using different ALD process sequences. The use of a multi-zone, combinatorial, single wafer showerhead ensures that there are no reactions within the showerhead or the channels. Properties of the thin film and showerhead puck performance may be evaluated, characterized, and compared against a set of selection criteria. Examples of selection criteria comprise film composition, film uniformity, film deposition rate, film electrical properties, film density, film stress, film contamination content, particle contamination, material deposition on the showerhead puck surfaces, clogging of the channels in the showerhead pucks, etc. In this configuration, any differences in the film properties will be attributable to the differences in the process sequence performed in the various showerhead pucks sequences.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A process chamber comprising:
   a substrate support; and
   a multi-zone showerhead comprising:
      a backing plate comprising a plurality of cavities formed therein;
      a plurality of mounting frames coupled to the backing plate such that the plurality of mounting frames are external to the backing plate; and
      a plurality of showerhead pucks, wherein each of the plurality of showerhead pucks comprises a plurality of channels formed therethrough and is configured to be removably holdable by a respective one of the plurality of mounting frames, wherein when each of the plurality of showerhead pucks is held by the respective one of the plurality of mounting frames, the respective showerhead puck is adjacent to and external to the backing plate, and the plurality of channels formed therethrough are in fluid communication with at least one of the plurality of cavities formed in the backing plate,
      wherein a first of the plurality of showerhead pucks is held by a first of the plurality of mounting frames, and a second of the plurality of showerhead pucks is held by the second of a plurality of mounting frames, and
      wherein the first of the plurality of showerhead pucks has a thickness that is less than a thickness of the second of the plurality of showerhead pucks, and the first of the plurality of mounting frames has a thickness that is more than a thickness of a second of the plurality of mounting frames such that a combined thickness of the first of the plurality of showerhead pucks and the first of the plurality of mounting frames is the same as a combined thickness of the second of the plurality of showerhead pucks and the second of the plurality of mounting frames.

2. The process chamber of claim 1 wherein when the plurality of showerheads pucks are held by the plurality of mounting frames, each showerhead puck of the plurality of showerhead pucks is positioned below the backing plate and external to the other showerhead pucks of the plurality of shower head pucks, and a portion of each mounting frame of the plurality of mounting frames is positioned below the backing plate.

3. The process chamber of claim 1 wherein one of the plurality of showerhead pucks has at least one of a different number of the plurality of channels than at least another of the plurality of showerhead pucks, a different size of the plurality of channels than at least another of the plurality of showerhead pucks, or a different distribution of the plurality of channels than at least another of the plurality of showerhead pucks.

4. The process chamber of claim 1, wherein the first of the plurality of showerhead pucks is adjacent to a first portion of the backing plate, and the second of the plurality of showerhead pucks is adjacent to a second portion of the backing plate, and wherein the first portion of the backing plate has a thickness that is the same as a thickness of the second portion of the backing plate.

5. The process chamber of claim 1 wherein a distance between the first of the plurality of mounting frames and the substrate support is the same as a distance between the second of the plurality of mounting frames and the substrate support, said distances being measured in a direction that is substantially perpendicular to an upper surface of the substrate support.

6. A vapor deposition system comprising:
   a process chamber;
   a substrate support disposed within the process chamber; and
   a multi-zone showerhead disposed within the process chamber above the substrate support, wherein the multi-zone showerhead comprises:
      a backing plate comprising a plurality of cavities formed therein;
      a plurality of mounting frames coupled to the backing plate such that the plurality of mounting frames are external to the backing plate; and
      a plurality of showerhead pucks, wherein each of the plurality of showerhead pucks comprises a plurality of channels formed therethrough and is configured to be removably holdable by a respective one of the plurality of mounting frames, wherein when each of the plurality of showerhead pucks is held by the respective one of the plurality of mounting frames, the respective showerhead puck is adjacent to and external to the backing plate, and the plurality of channels formed therethrough are in fluid communication with at least one of the plurality of cavities formed in the backing plate such that when a processing fluid is delivered into the at least one of the plurality of cavities in the backing plate, the processing fluid flows through the plurality of channels and onto a substrate on the substrate support,
      wherein a first of the plurality of showerhead pucks is held by a first of the plurality of mounting frames, and a second of the plurality of showerhead pucks is held by the second of a plurality of mounting frames, and
      wherein the first of the plurality of showerhead pucks has a thickness that is less than a thickness of the second of the plurality of showerhead pucks, and the first of the plurality of mounting frames has a thickness that is more than a thickness of a second of the plurality of mounting frames such that a combined thickness of the first of the plurality of showerhead pucks and the first of the plurality of mounting frames is the same as a combined thickness of the second of the plurality of showerhead pucks and the second of the plurality of mounting frames.

7. The vapor deposition system of claim 6 wherein when the plurality of showerheads pucks are held by the plurality of mounting frames, each showerhead puck of the plurality of showerhead pucks is positioned below the backing plate and external to the other showerhead pucks of the plurality of shower head pucks, and a portion of each mounting frame of the plurality of mounting frames is positioned below the backing plate.

8. The vapor deposition system of claim 6 wherein one of the plurality of showerhead pucks has at least one of a different number of the plurality of channels than at least another of the plurality of showerhead pucks, a different size of the plurality of channels than at least another of the plurality of showerhead pucks, or a different distribution of the plurality of channels than at least another of the plurality of showerhead pucks.

9. The vapor deposition system of claim 6, wherein the first of the plurality of showerhead pucks is adjacent to a first portion of the backing plate, and the second of the plurality of showerhead pucks is adjacent to a second portion of the backing plate, and wherein the first portion of the backing plate has a thickness that is the same as a thickness of the second portion of the backing plate.

10. The vapor deposition system of claim 6 wherein a distance between the first of the plurality of mounting frames and the substrate support is the same as a distance between the second of the plurality of mounting frames and the substrate support, said distances being measured in a direction that is substantially perpendicular to an upper surface of the substrate support.

11. A vapor deposition system comprising:
a process chamber;
a substrate support disposed within the process chamber;
a multi-zone showerhead disposed within the process chamber above the substrate support, wherein the multi-zone showerhead comprises:
a backing plate comprising a plurality of cavities formed therein;
a plurality of mounting frames coupled to the backing plate such that the plurality of mounting frames are external to the backing plate; and
a plurality of showerhead pucks, wherein each of the plurality of showerhead pucks comprises a plurality of channels formed therethrough and is configured to be removably holdable by a respective one of the plurality of mounting frames, wherein when each of the plurality of showerhead pucks is held by the respective one of the plurality of mounting frames, the respective showerhead puck is adjacent to and external to the backing plate, and the plurality of channels formed therethrough are in fluid communication with a respective one of the plurality of cavities formed in the backing plate such that when a processing fluid is delivered into the one of the plurality of cavities in the backing plate, the processing fluid flows through the plurality of channels and onto a substrate on the substrate support,
wherein a first of the plurality of showerhead pucks is held by a first of the plurality of mounting frames, and a second of the plurality of showerhead pucks is held by the second of a plurality of mounting frames, and
wherein the first of the plurality of showerhead pucks has a thickness that is less than a thickness of the second of the plurality of showerhead pucks, and the first of the plurality of mounting frames has a thickness that is more than a thickness of a second of the plurality of mounting frames such that a combined thickness of the first of the plurality of showerhead pucks and the first of the plurality of mounting frames is the same as a combined thickness of the second of the plurality of showerhead pucks and the second of the plurality of mounting frames; and
a plasma source coupled to the multi-zone showerhead and configured to deliver a plasma generated species to only some of the plurality of cavities within the backing plate.

12. The vapor deposition system of claim 11 wherein when the plurality of showerhead pucks are held by the plurality of mounting frames, each showerhead puck of the plurality of showerhead pucks is positioned below the backing plate and external to the other showerhead pucks of the plurality of showerhead pucks, and a portion of each mounting frame of the plurality of mounting frames is positioned below the backing plate.

13. The vapor deposition system of claim 11 wherein a distance between the first of the plurality of mounting frames and the substrate support is the same as a distance between the second of the plurality of mounting frames and the substrate su ort, said distances being measured in a direction that is substantially perpendicular to an upper surface of the substrate support.

* * * * *